United States Patent
Ueda et al.

(10) Patent No.: US 9,572,251 B2
(45) Date of Patent: Feb. 14, 2017

(54) PRINTED CIRCUIT BOARD CONSISTING OF LAMINATED SUBSTRATES AND ELECTRONIC DEVICE COMPRISING THE SAME

(71) Applicant: NEC Corporation, Minato-ku, Tokyo (JP)

(72) Inventors: Akihiro Ueda, Tokyo (JP); Shinji Tanaka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 13/946,713

(22) Filed: Jul. 19, 2013

(65) Prior Publication Data

US 2014/0020941 A1 Jan. 23, 2014

(30) Foreign Application Priority Data

Jul. 20, 2012 (JP) ................................ 2012-161161

(51) Int. Cl.
*H05K 1/03* (2006.01)
*H05K 1/02* (2006.01)
*H05K 3/46* (2006.01)

(52) U.S. Cl.
CPC ............ *H05K 1/0306* (2013.01); *H05K 1/024* (2013.01); *H05K 3/4626* (2013.01); *H05K 2201/0187* (2013.01)

(58) Field of Classification Search
CPC .... H05K 1/0306; H05K 1/024; H05K 3/4626; H05K 2201/0187
USPC ................ 174/255, 250, 251, 253, 256–258
See application file for complete search history.

(56) References Cited

U.S. PATENT DOCUMENTS

2011/0308840 A1* 12/2011 Ooi et al. ...................... 174/251
2012/0328857 A1* 12/2012 Yajima ........................... 428/212

FOREIGN PATENT DOCUMENTS

| JP | S63-47135 A | 2/1988 |
|----|-------------|--------|
| JP | H04-24997 A | 1/1992 |
| JP | 2000-234239 A | 8/2000 |
| JP | 2003-218535 A | 7/2003 |

OTHER PUBLICATIONS

Japanese Office Action for JP Application No. 2012-161161 mailed on Jul. 23, 2013 with English Translation.

* cited by examiner

*Primary Examiner* — Tremesha S Willis (57) ABSTRACT

Provided is a printed circuit board consisting of laminated substrates each with a fiberglass cloth contained in its resin and with a wiring arranged onto at least one of its surfaces, wherein, in at least one of substrates provided with a wiring for transmitting a higher speed signal than that transmitted by wirings arranged onto the other substrates, a fiberglass cloth having a different property from that of the other substrates is contained.

9 Claims, 6 Drawing Sheets

PRINTED CIRCUIT BOARD CONSISTING OF LAMINATED SUBSTRATES AND ELECTRONIC DEVICE COMPRISING THE SAME

This application is based upon and claims the benefit of priority from Japanese Patent Application No. 2012-161161, filed on Jul. 20, 2012, the disclosure of which is incorporated herein in its entirety by reference.

TECHNICAL FIELD

The present invention relates to the structure of a printed circuit board and also to an electronic device comprising the printed circuit board. In particular, it relates to the substrate structure of a printed circuit board containing fiberglass cloth.

BACKGROUND ART

In recent years, with the increase in data processing speed of calculating equipment such as a computer, decrease in the dielectric constant of a printed circuit board is demanded.

A printed substrate used for a usual printed circuit board is fabricated by impregnating a base material such as a fiberglass cloth or a paper with resin material. Accordingly, in decreasing the dielectric constant of a printed circuit board, effective is decrease in the dielectric constant of a fiberglass cloth or of a resin.

Further, in recent years, with the increase in scale of an LSI (Large Scale Integration), degradation in reliability of a connection between a BGA (Ball Grid Array) package and a printed circuit board owing to the difference between their thermal expansion coefficients has become a problem. For the purpose of improving such connection reliability, demanded is decrease in the thermal expansion coefficient of a printed circuit board.

As a method of fabricating a printed circuit board by the use of a low dielectric constant resin, it is considered, for example, to use the low dielectric constant resin only for a layer for transmitting a high speed signal and use a usual resin for the other layers. The cost of such a printed circuit board using a low dielectric constant resin only for a layer for transmitting a high speed signal and using a resin with a usual dielectric constant for the other layers is lower than that of a printed circuit board with all layers made of the low dielectric constant resin.

However, in the case of such a printed circuit board using a low dielectric constant resin only for a layer for transmitting a high speed signal and a usual resin for the other layers, the use of different resins in the fabrication process lowers the productivity.

As a fiberglass cloth with a lower dielectric constant and a lower thermal expansion coefficient compared to that made of E-glass, which is a usual 10 fiberglass cloth, for example, there are fiberglass cloths made of D-glass, S-glass and the like. However, the use of these fiberglass cloths has a problem in that the cost of substrate material becomes high. Additionally, D-glass has a problem with drill processability such as wear of a drill and hole positioning accuracy in drilling.

Patent Document 1 (Japanese Laid-open Patent Application No. 2000-234239) discloses, as a substrate for a printed circuit board with low dielectric constant, low cost and excellent drill processability, a substrate using a fiberglass cloth in which either of its warp and weft is made from E-glass and the other from D-glass. Through such combining of different types of glass yarn, the fiberglass cloth of Patent Document 1 can be given a different property from the original one. Further, by fabricating a printed circuit board with the fiberglass cloth of Patent Document 1, decrease in dielectric constant and that in thermal expansion coefficient become possible.

However, even in the case of using a fiberglass cloth consisting of different types of glass yarn such as in Patent Document 1, there is no change in the fact that a high cost material with a low dielectric constant or a low thermal expansion coefficient is used as the warp or the weft. Accordingly, the fiberglass cloth of Patent Document 1 has a problem in that it costs higher than a usual fiberglass cloth.

Further, the printed circuit board according to Patent Document 1 has a structure consisting of laminated fiberglass cloths each containing low dielectric constant glass yarn with poor drill processability. Accordingly, the fiberglass cloth of Patent Document 1 has also a problem with wear of a drill and hole positioning accuracy in drilling, if compared with a usual fiberglass cloth.

The objective of the present invention is to provide a printed circuit board which enables transmission of a high speed signal, with low cost and with no degradation in processability.

SUMMARY

A printed circuit board of the present invention is a printed circuit board fabricated by laminating substrates each of which contains a fiberglass cloth in its resin and is provided with a wiring on at least one of its surfaces, wherein at least one of the substrates provided with a wiring for transmission of a higher speed signal than that transmitted by wirings on the other substrates contains a fiberglass cloth with a different property from that in the other substrates.

BRIEF DESCRIPTION OF THE DRAWINGS

Exemplary features and advantages of the present invention will become apparent from the following detailed description when taken with the accompanying drawings in which.

EXEMPLARY EMBODIMENT

Exemplary embodiments of the present invention will be described in detail, with reference to drawings. Here, configurations and numerical values of exemplary embodiments of the present invention are not limited to those shown in the drawings.

(First Exemplary Embodiment)

Figure 1:
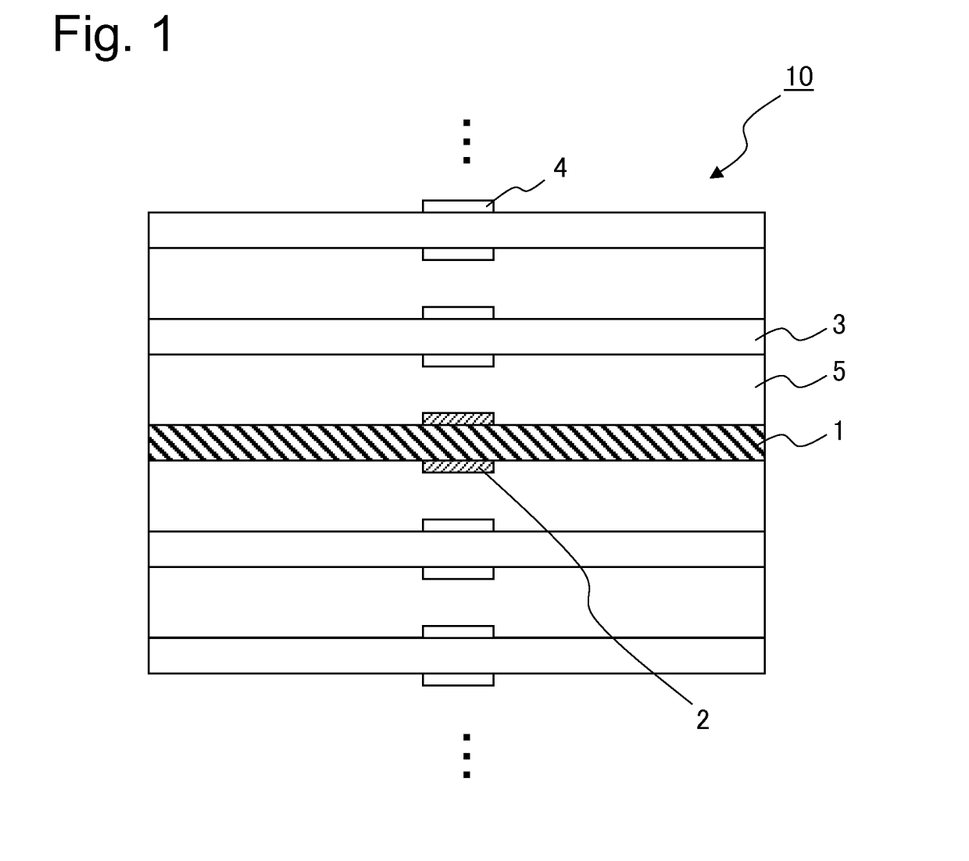
FIG. 1 a schematic diagram showing a cross section of a printed circuit board according to a first exemplary embodiment of the present invention.

FIG. 1 is a schematic diagram showing a cross section of a printed circuit board according to a first exemplary embodiment of the present invention.

The printed circuit board 10 of the first exemplary embodiment is the one made up of a laminated plurality of substrates each having a wiring 4, where at least one substrate having a high speed signal wiring 2 is included. In the diagram of FIG. 1, the high speed signal wiring 2 and each of the wirings 4 are drawn to be stacked in a line perpendicular to the principal surfaces of a low dielectric constant core 1 and cores 3. However, there is no restriction on the inter-substrate positional relationship between the high speed signal wiring 2 and the wirings 4.

As shown in FIG. 1, the high speed signal wiring 2 is printed on both or either of the principal surfaces of the low dielectric constant core 1. On each of the cores 3, printed is the wiring 4 requiring no high speed transmission. The low dielectric constant core 1 and the cores 3 are laminated with a prepreg 5 inserted at each interface between the cores, 1 or 3, thus constituting the printed circuit board 10.

Figure 2A:
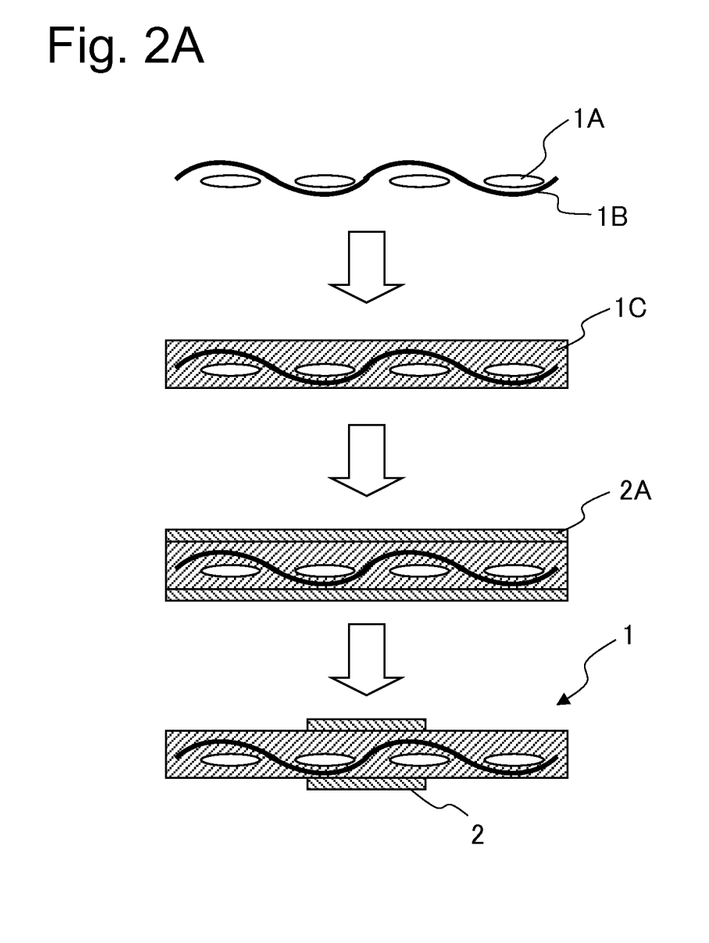
FIG. 2A a schematic diagram showing an example of a fabrication method of a fiberglass cloth according to the first exemplary embodiment of the present invention.

As shown in FIG. 2A, the low dielectric constant core 1 comprises warp 1A, weft 1B and a resin 1C.

As the warp 1A and the weft 1B, a low dielectric constant glass material can be used. For example, D-glass (SiO2: 75-76%, B2O3: 19-20%, R2O: <3%, Al2O3, CaO and MgO: <1%) and S-glass (SiO2: 62-65%, Al2O3: 20-25%, MgO: 10-10%, R2O and B2O3: 0-1%) can be used.

E-glass, usually used as the glass yarn of a fiberglass cloth, is a general alumino-borosilicate glass (SiO2: 53-56%, Al2O3: 14-18%, CaO: 20-24%, B2O3: 5-10%, MgO and R2O: <1%). The relative dielectric constant of E-glass is equal to or higher than 6.0 at the frequency of 1 MHz at room temperature.

In contrast to that, the relative dielectric constant at the frequency of 1 MHz at room temperature of a low dielectric constant material is, for 10 example, equal to or lower than 4.5 for D-glass, and about 5.2 for S-glass. A printed circuit board using E-glass cannot sufficiently meet the demands for higher densification and for higher speed signal processing, but a printed circuit board using D-glass or S-glass can sufficiently meet the demands. Here, materials for the warp 1A and the weft 1B are not limited to these ones, and what 15 is required of them is only to have a dielectric constant lower than that of E-glass and the like which are used for the glass yarn of usual fiberglass cloths.

For the resin 1C, for example, epoxy resin, phenol resin, polyimide resin and the like can be used. Specifically, considering electrical properties and adhesive properties, epoxy resin being a thermosetting resin is most suitable. To be mentioned as epoxy resins are, for example, bisphenol A type, bisphenol F type, bisphenol S type, phenol novolac type, bisphenol A novolac type, bisphenol F novolac type, cresol novolac type and diaminodiphenylmethane type epoxy resins, and the like. It is also possible to use an epoxy resin which is flame-retarded by substituting a proportion of hydrogen atoms existing in the above-mentioned epoxy resin structures with halogen atoms, and the like. Here, the resin 1C is not limited to these materials. Further, the resin 1C may contain curing agent, curing accelerator agent, inorganic filler and the like.

A fabrication method of the low dielectric constant core 1 will be described, with reference to FIG. 2A. Here, the low dielectric constant core 1 can be fabricated by a conventional fabrication method of substrate.

A fiberglass cloth consisting of the warp 1A and weft 1B made from low dielectric constant material is impregnated with the resin 1C. As the resin 1C, a thermosetting resin such as the above-described epoxy resins can be used. Here, if silane coupler treatment is applied to the surfaces of the fiberglass cloth before impregnating the fiberglass cloth with the resin 1C, adhesiveness between the fiberglass cloth surfaces and the resin 1C is increased.

Next, the resin 1C is cured, and then a conductive layer 2A is formed on both of the principal surfaces of the resin 1C. Here, before the formation of the conductive layer 2A, as necessary, a dry film may be pasted onto the principal surfaces of the low dielectric constant core 1.

Metals such as copper, silver and gold can be used for the conductive layer 2A. Considering the process and the cost, copper is most suitable for the conductive layer 2A. The conductive layer 2A can be formed by pasting metal foil onto the principal surfaces of the low dielectric constant core 1 and subsequently removing unnecessary portions of the metal foil by the use of an etching process described later or the like. The conductive layer 2A can be formed also by plating or the like. Further, besides metals, any material having conductivity selected from among semiconductor materials, conductive polymer materials and the like can be used as a material for the conductive layer 2A. The conductive layer 2A can be fabricated also by drawing a wiring pattern of conductive resin on the principal surfaces of the low dielectric constant substrate 1, for example, by the use of screen printing or the like.

In the case of using metal foil as the conductive layer 2A, a portion of the conductive layer 2A to constitute a wiring pattern of the high speed signal wiring 2 is covered with resist, and then unnecessary portions of the conductive layer 2A are removed by etching. By this way, a wiring pattern of the high speed signal wiring 2 is fabricated on the surfaces of the low dielectric constant core 1.

The above is a simplified description of a fabrication method of the low dielectric constant core 1. Here, any other method than the above-described one may be used as a fabrication method of the low dielectric constant core 1.

Figure 2B:
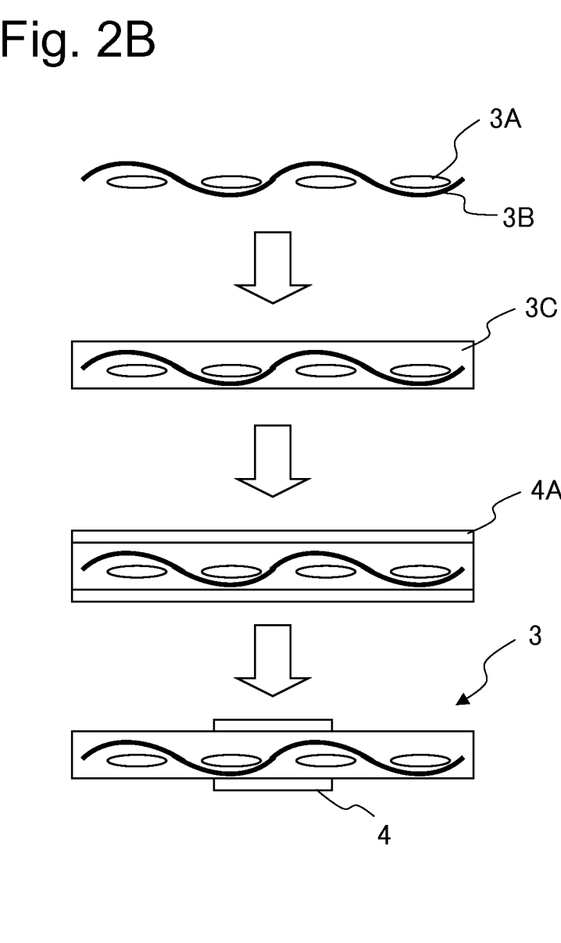
FIG. 2B a schematic diagram showing another example of a fabrication method of a fiberglass cloth according to the first exemplary embodiment of the present invention.

A structure of the core 3 having a usual dielectric constant is shown in FIG. 2B. The core 3 comprises warp 3A, weft 3B and a resin 3C. The structure of the core 3 is similar to that of the low dielectric constant core 1 except for that it uses a usual material for the glass yarn.

A glass material having a usual dielectric constant can be used for the warp 3A and weft 3B. For example, E-glass can be used. However, a material for the warp 3A and weft 3B is not limited to it.

As the resin 3C, for example, epoxy resin, phenol resin, polyimide resin and the like can be used. In particular, epoxy resin being a thermosetting resin is suitable. Here, the resin 3C may be made from the same material as that for the resin 1C. However, a material for the resin 3C is not limited to those ones described above. Further, the resin 3C may contain curing agent, curing accelerator agent, inorganic filler and the like.

It is preferable to use the same material for the resin 3C as that for the resin 1C so that their physical properties such as dielectric constants and thermal expansion coefficients coincide with each other. However, it is not necessarily required to use completely the same material for the resins 1C and 3C as long as the difference in physical properties between the two resins is within a range not to cause peeling off between them under the usage environment of the printed circuit board.

The prepreg 5 is a layer to bond the low dielectric constant core 1 and the core 3 to each other. The prepreg 5 is the one made by impregnating fiberglass cloth, paper and the like with varnish containing resin such as a thermosetting resin. As a resin material used for the prepreg 5, the materials mentioned above as specific examples of the resin 1C may be employed. Further, the prepreg 5 may contain curing agent, curing accelerator agent, inorganic filler and the like. Here, a material for the prepreg 5 is not limited to those ones described above.

As the prepreg 5, a glass epoxy substrate, a glass composite substrate, a glass polyimide substrate, a paper phenol substrate, a paper epoxy substrate and the like can be used. Specifically, as the prepreg 5, it is preferable to use a substrate whose physical properties are close to that of the resin material and fiberglass cloth constituting a substrate to be bonded to the prepreg 5.

A fabrication method of the core 3 will be described with reference to FIG. 2B. Here, the core 3 can be fabricated by a conventional fabrication method of substrate.

A fiberglass cloth using glass yarn made from a usual material as the warp 3A and weft 3B is impregnated with the resin 3C. Here, the warp 3A and the weft 3B, of the fiberglass cloth, do not necessarily need to be made from the same material. As the resin 3C, a thermosetting resin such as epoxy resin can be used. Here, if silane coupler treatment is applied to the surfaces of the fiberglass cloth before impregnating the fiberglass cloth with the resin 3C, adhesiveness between the fiberglass cloth surfaces and the resin 3C is increased.

Next, the resin 3C is cured, and then a conductive layer 4A is formed on both of the principal surfaces of the resin 3C. Here, before the formation of the conductive layer 4A, as necessary, a dry film may be pasted onto the principal surfaces of the core 3.

The conductive layer 4A can be formed using metal foil, a metal plating layer, conductive paste and the like. Here, the conductive layer 4A of the core 3 may be of the same configuration as that of the conductive layer 2A of the low dielectric constant core 1.

In the case of using metal foil as the conductive layer 4A, a portion of the conductive layer 4A to constitute a wiring pattern of the wiring 4 is covered with resist, and then unnecessary portions of the conductive layer 4A are removed by etching. By this way, a wiring pattern of the wiring 4 is fabricated on the surfaces of the core 3.

The above is a simplified description of a fabrication method of the core 3. Here, any other method than the above-described one may be used as a fabrication method of the core 3.

Figure 3:
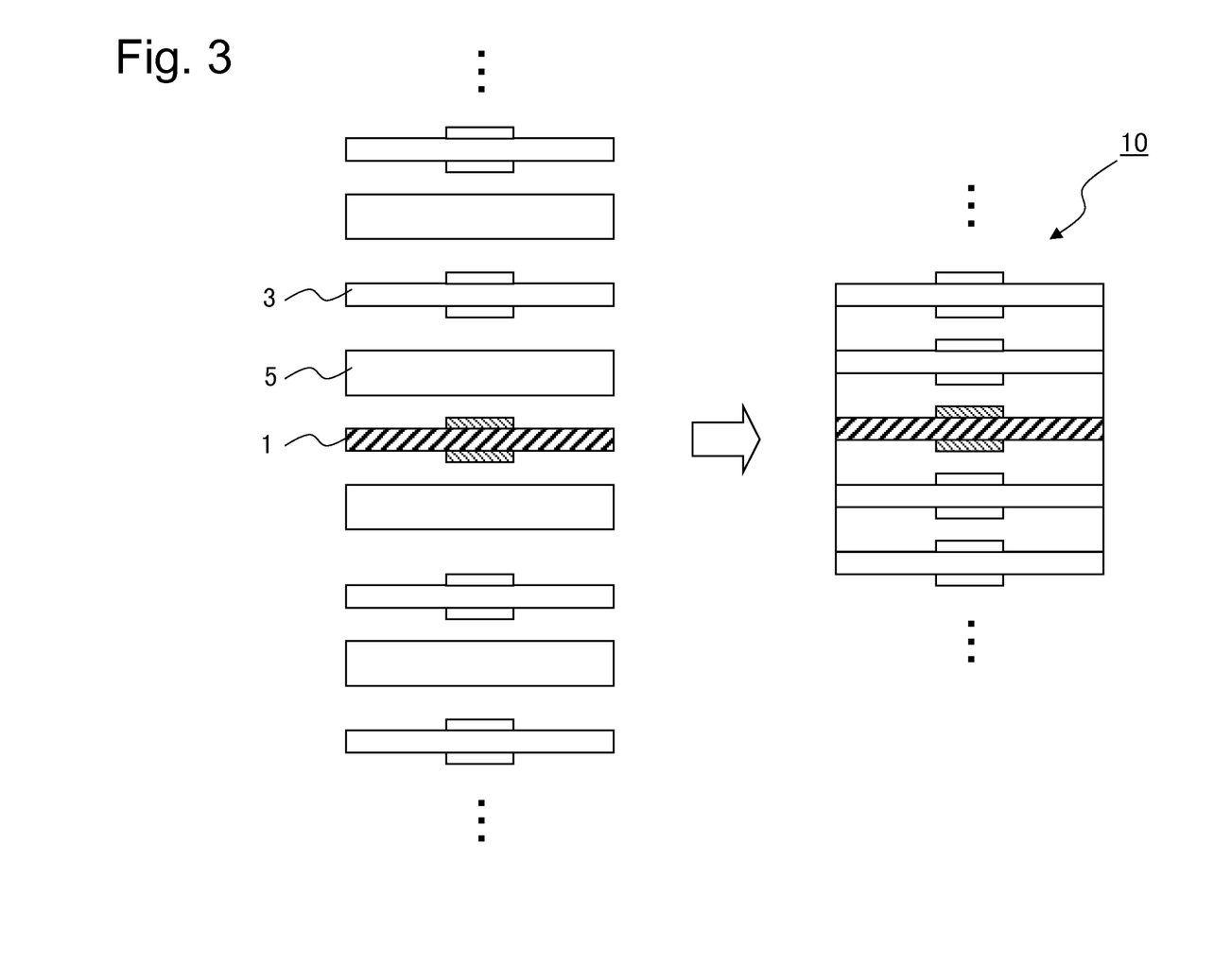
FIG. 3 a schematic diagram showing still another example of a fabrication method of a printed circuit board according to the first exemplary embodiment of the present invention.

Next, simplified description will be given of a fabrication method of the printed circuit board 10 according to the first exemplary embodiment, with reference to FIG. 3. Here, the printed circuit board 10 can be fabricated by a conventional fabrication method of printed circuit board.

First, a combination of the low dielectric constant core 1, the core 3 and the prepreg 5 is determined, and they are laminated together. A way of combining these substrates is optional. Position alignment of the low dielectric constant core 1 or the core 3, on whose surfaces wiring patterns have been fabricated, is performed by the use of a mass lamination method, which is a method of position alignment by an image, or a pin lamination method, which is a method of position alignment using pins. When a signal line is included in the printed circuit, it will be better to use a pin lamination method. Further, blackening of the wiring patterns may be performed before the lamination of the substrates.

Next, the laminated substrate thus combined is shaped by pressing it in the direction perpendicular to its surface. At that time, processing of applying heat or the like to the laminated substrate may be performed.

Finally, removing a portion of the wiring pattern material remaining at the periphery of the laminated substrate, the printed circuit board 10 is completed.

The above is a fabrication method of the printed circuit board according to the first exemplary embodiment. Here, the above-described fabrication method is just an example and does not limit the present invention.

As has been described above, with the printed circuit board according to the first exemplary embodiment of the present invention, since a low dielectric constant material is used for a core provided with a high speed signal wiring, high speed transmission of a signal propagating through the high speed signal wiring becomes possible.

The printed circuit board according to the first exemplary embodiment of the present invention uses a highly functional, low dielectric constant material not for all layers but only for the substrate of a layer required to provide high speed signal transmission. Accordingly, the usage of low dielectric constant material in the printed circuit board as a whole can be reduced, and thus the cost of the printed circuit board can be reduced compared to a usual printed circuit board with all layers made of low dielectric constant material. When there are a plurality of substrates each provided with a wiring required to provide high speed signal transmission, it is only necessary to use low dielectric constant material for all of those substrates.

In the printed circuit board according to the first exemplary embodiment of the present invention, since high speed signal transmission needs to be enabled only on some of wiring layers, all layers of the printed circuit board can be constituted by the same resin material. Accordingly, compared to a printed circuit board with all layers made of low dielectric constant material, there occurs no need, with respect to resin material, for change of the process condition and that of the certification of safety standard, and also does no degradation in productivity.

Among glass yarns containing low dielectric material, there are ones, such as that made from a D-glass, for example, which are harder than a usual one. When a printed circuit board is fabricated by laminating substrates having such low dielectric constant material, there arises a problem with drill processability. However, in the printed circuit board according to the first exemplary embodiment of the present invention, low dielectric constant material is used only for some of the substrate layers. As a result, with regard to the printed circuit board according to the first exemplary embodiment of the present invention, there occurs no remarkable degradation in processability, compared to a usual printed circuit board using low dielectric material for all substrate layers.

(Second Exemplary Embodiment)

Figure 4:
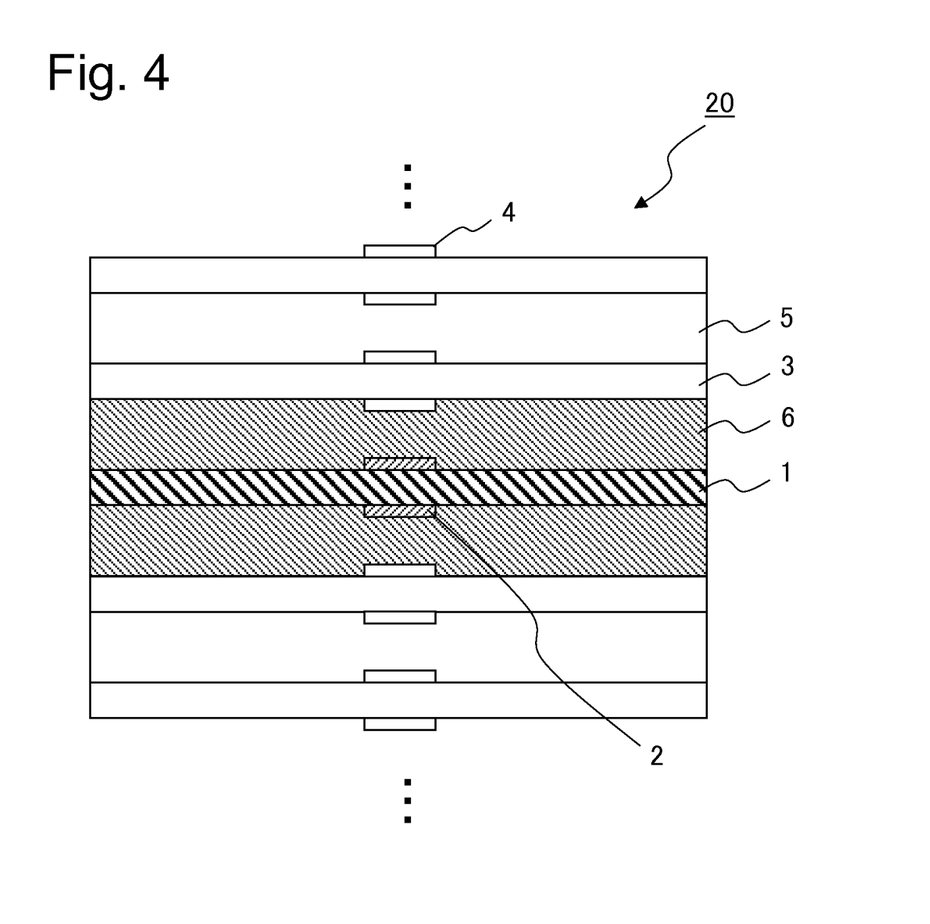
FIG. 4 a schematic diagram showing a cross section of a printed circuit board according to a second exemplary embodiment of the present invention.

FIG. 4 is a schematic diagram showing a cross section of a printed circuit board according to a second exemplary embodiment of the present invention.

The printed circuit board 20 of the second exemplary embodiment is different from the printed circuit board 10 of the first exemplary embodiment in that it uses a low dielectric constant prepreg 6 for layers in contact with the principal surfaces of the low dielectric constant core 1 provided with the high speed signal wiring 2. Except for the low dielectric constant prepreg 6, the printed circuit board 20 of the second exemplary embodiment is of the same structure as that of the printed circuit board 10 of the first exemplary embodiment. Further, the printed circuit board 20 of the second exemplary embodiment can be fabricated by the same fabrication process as that of the printed circuit board 10 of the first exemplary embodiment.

The low dielectric constant prepreg 6 is defined to be the one in which at least either of the resin and the glass yarn contains low dielectric constant material. Specifically, it is preferable that the glass yarn contains low dielectric constant material. For example, if the same fiberglass cloth and the same resin material are used in the low dielectric constant core 1 and the low dielectric constant prepreg 6, because a parameter such as thermal expansion coefficient is uniform at a point of bonding between the resins, peeling off or the 30 like hardly occur. Even if the low dielectric constant core 1 and the low dielectric constant prepreg 6 are made of respective fiberglass cloths each containing a different low dielectric constant material from the other's, more stable high speed signal transmission can be achieved, compared to the printed circuit board 10 of the first exemplary embodiment. Here, of the low dielectric constant prepreg 6, what is required is only to have a lower dielectric constant than that of a usual prepreg, and thus the form is in no way limited.

In the printed circuit board 20 of the second exemplary embodiment, the structure becomes such that the high speed signal wiring 2 is sandwiched by the low dielectric constant core 1 and the low dielectric constant prepreg 6. Accordingly, compared to the printed circuit board 10 of the first exemplary embodiment, more stable high speed signal transmission can be achieved in the printed circuit board 20 of the second exemplary embodiment.

The cost is slightly higher for the printed circuit board according to the second exemplary embodiment owing to the use of the low dielectric constant prepreg 6, compared to the printed circuit board of the first exemplary embodiment. However, the cost increase is smaller than that for a usual printed circuit board using low dielectric material, since low dielectric constant material is used only for a limited portion in the printed circuit board according to the second exemplary embodiment.

Since the printed circuit board of the second exemplary embodiment uses low dielectric material for prepregs facing the high speed signal wirings, its drill processability becomes slightly worse than that of the first exemplary embodiment. However, the drill processability is still better than that of a usual printed circuit board using low dielectric material, since the printed circuit board of the second exemplary embodiment uses low dielectric constant material for a smaller number of substrates.

(Third Exemplary Embodiment)

Figure 5:
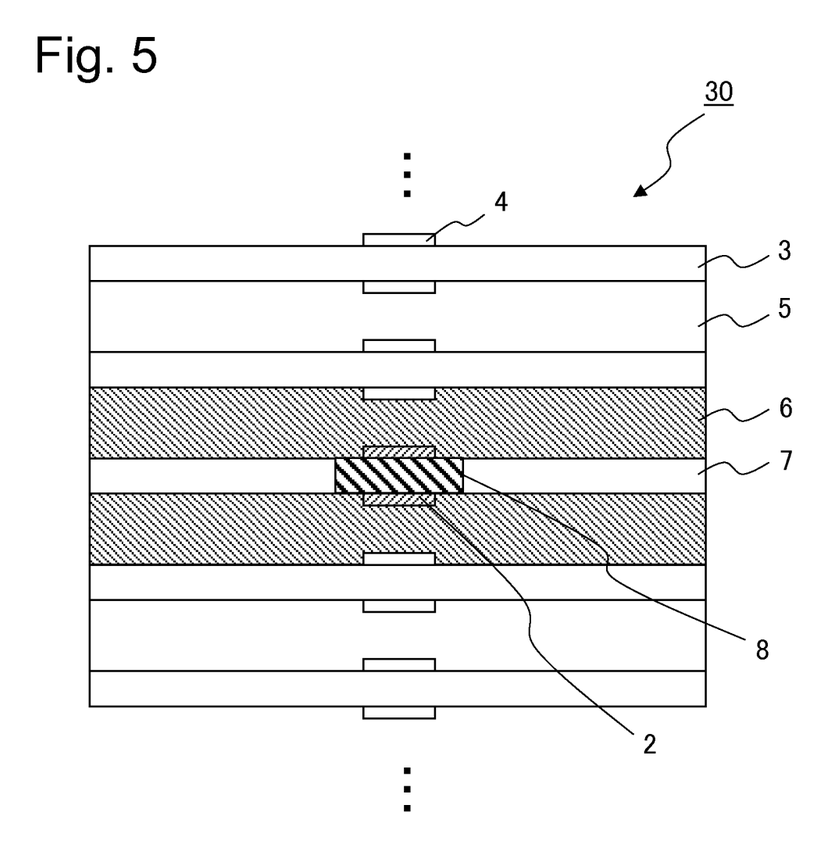
FIG. 5 a schematic diagram showing a cross section of a printed circuit board according to a third exemplary embodiment of the present invention.

FIG. 5 is a schematic diagram showing a cross section of a printed circuit board according to a third exemplary embodiment of the present invention.

The printed circuit board 30 of the third exemplary embodiment is different from the printed circuit board 20 of the second exemplary embodiment in that it uses a low dielectric constant core 7 comprising a low dielectric constant material portion 8, which is arranged so that the core 7 uses low dielectric material only for a portion where the high speed signal wiring 2 is arranged. It is also possible to use the usual prepreg 5 in place of the low dielectric constant prepreg 6. That is, also possible is a structure obtained by replacing, in the first exemplary embodiment, the low dielectric constant core 1 by the low dielectric constant core 7 comprising the low dielectric constant material portion 8.

Except for the low dielectric constant core 7, the printed circuit board 30 of the third exemplary embodiment is of the same structure as that of the printed circuit board 20 of the second exemplary embodiment. In the printed circuit board 30 of the third exemplary embodiment, the low dielectric constant core 7 needs only to be such that, for example, low dielectric constant glass yarn is used only for its portion to be provided with the high speed signal wiring 2. Here, the portion to be provided with the high speed signal wiring 2 is set to have a size in a range not to lower the transmission speed of a high speed signal propagating through the high speed signal wiring 2 compared to the printed circuit board 20 of the second exemplary embodiment.

The printed circuit board 30 of the third exemplary embodiment can be fabricated by the same fabrication process as that of the printed circuit board 10 of the first exemplary embodiment.

In the printed circuit board 30 of the third exemplary embodiment, since the both principal surfaces of the high speed signal wiring 2 are covered with low dielectric constant material, the same degree of high speed signal transmission as that in the printed circuit board 20 of the second exemplary embodiment becomes possible.

Further, since it uses low dielectric constant material only immediately under the high speed signal wiring 2, the material cost of the low dielectric constant material can be reduced.

With the printed circuit board 30 according to the third exemplary embodiment, high speed transmission of a signal becomes possible similarly to the first and the second exemplary embodiments.

Further, in the printed circuit board 30 of the third exemplary embodiment, since the proportion of a low dielectric constant material portion is decreased, drilling of a low dielectric constant material portion less frequently occurs in drill processing, and the drill processability is thus improved.

(Fourth Exemplary Embodiment)

Figure 6:
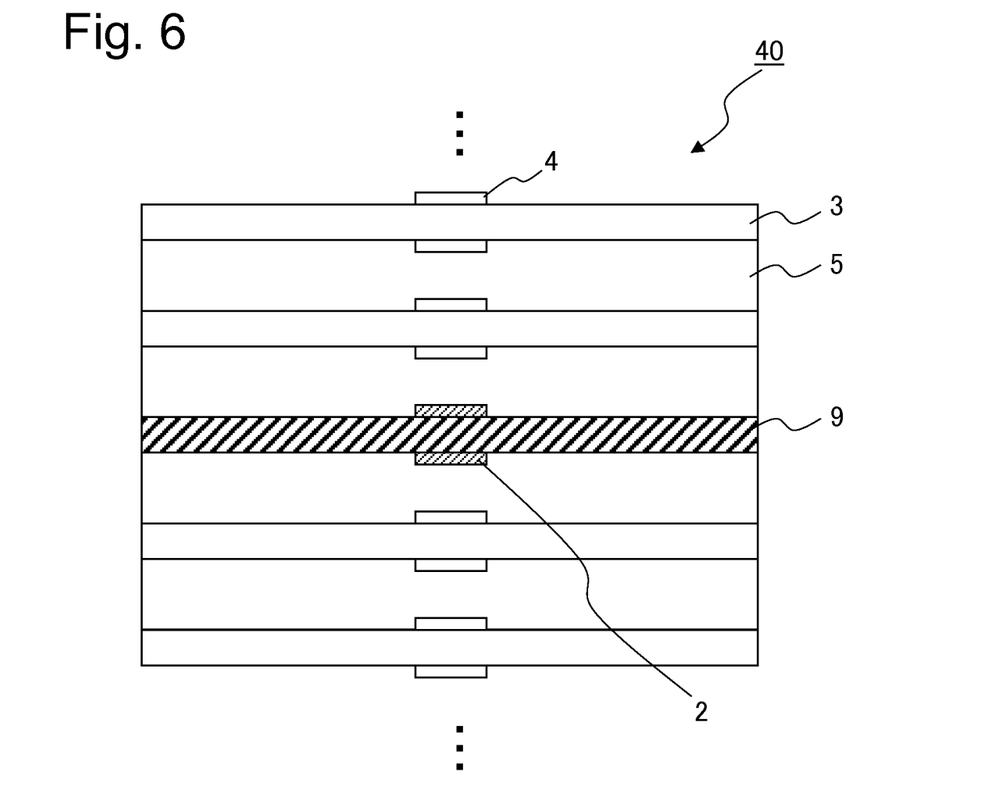
FIG. 6 a schematic diagram showing a cross section of a printed circuit board according to a fourth exemplary embodiment of the present invention.

FIG. 6 is a schematic diagram showing a cross section of a printed circuit board according to a fourth exemplary embodiment of the present invention.

The printed circuit board 40 of the fourth exemplary embodiment is different from the printed circuit board 10 of the first exemplary embodiment in that it uses a low thermal expansion coefficient core 9 comprising a low thermal expansion coefficient material as a core to be provided with the high speed signal wiring 2. Except for the low thermal expansion coefficient core 9, the structure of the printed circuit board 40 according to the fourth exemplary embodiment is the same as that of the printed circuit board 10 of the first exemplary embodiment. Here, if the thermal expansion coefficient of the low dielectric constant core 1 is low, the substrate can be regarded as a substrate layer of both low dielectric constant and low thermal expansion coefficient. The printed circuit board 40 of the fourth exemplary embodiment can be fabricated by the same fabrication process as that of the printed circuit board 10 of the first exemplary embodiment.

The low thermal expansion coefficient core 9 is used in the printed circuit board 40 of the fourth exemplary embodiment. In the low thermal expansion coefficient core 9, at least either of the fiberglass cloth or the resin comprises low thermal expansion coefficient material. As a material for the fiberglass cloth, D-glass and S-glass can be used, for example. The thermal expansion coefficient of E-glass is about 5.6 ppm/K. In contrast to that, the thermal expansion coefficients of S-glass and D-glass are as low as about 2.4 ppm/K and about 3.1 ppm/K, respectively, compared to that of E-glass. Here, what is required of a material used for the fiberglass cloth is only to have a lower thermal expansion coefficient than that of E-glass, a usual fiberglass cloth material, and hence the material is not limited to the ones mentioned above.

Although also possible is the use of low thermal expansion coefficient material as the material for the resin, it is unfavorable that the use of a material having a largely different thermal expansion coefficient from that of the resin material of the other cores 3 induces peeling off between different resins. Therefore, it is preferable to use a material with the difference in thermal expansion coefficient within a range not to cause peeling off between the resins.

Using the low thermal expansion coefficient core 9 described above, because degradation of a portion where different wirings are bonded to each other by a solder ball or the like due to thermal stress is reduced, the reliability of the connection can be improved. Further, using a low dielectric constant material such as D-glass and S-glass for the fiberglass cloth, because its effect as a low dielectric constant material is also obtained, it becomes possible to achieve a high speed signal wiring with improved connection reliability.

Further, although they are not shown in a drawing, modification examples obtained by replacing, in the printed circuit board according to the second or the third exemplary embodiments, the portions of low dielectric constant by a low thermal expansion coefficient material can also provide the same effect as that of the fourth exemplary embodiment.

The printed circuit boards according to the first to fourth exemplary embodiments can be used for, for example, electronic devices such as general-purpose computers including a desktop computer, a laptop computer and the like, a server and large scale computers including a supercomputer. The printed circuit boards according to the first to fourth exemplary embodiments can also be used for electronic devices such as a cellular phone and portable terminals including a smart phone. The printed circuit boards according to the first to fourth exemplary embodiments can also be used for portable electronic devices such as an electronic organizer, electronic dictionary, calculator, digital camera and digital camcorder.

The printed circuit boards according to the first to fourth exemplary embodiments can also be applied to electronic devices used in home electric appliances such as a television, display, DVD recorder, hard disk recorder, microwave oven, refrigerator and washing machine. They can also be applied to electronic devices used in a car, train, airplane, ship and spacecraft. Furthermore, possible is their application to electronic devices used in comparatively large scale systems or facilities such as a digital signage system, base station, electric power management system and power generation system. Still further, the printed circuit boards according to the exemplary embodiments of the present invention can be applied to any electronic devices using a printed circuit board, not limiting to the above-mentioned ones.

According to the present invention, a printed circuit board enabling transmission of a high speed signal can be provided at a low price without degrading the processability, since some of the fiberglass cloths are replaced by a functional material without changing resin material used for the substrates.

REFERENCE SIGNS LIST 1 low dielectric constant core
1A warp
1B weft
1C resin
2 high speed signal wiring
2A conductive layer
3 core
3A warp
3B weft
3C resin
4 wiring
4A conductive layer
5 prepreg
6 low dielectric constant prepreg
7 low dielectric constant core
8 low dielectric constant portion
9 low thermal expansion coefficient core
10, 20, 30, 40 printed circuit board The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. A printed circuit board comprising: a plurality of laminated substrates each comprising a plurality of layers and a fiberglass cloth contained in its resin and with a wiring arranged onto at least one of its surfaces, wherein at least one substrate of the plurality of substrates is provided with a wiring for transmitting a higher speed signal than that transmitted by wirings arranged onto the other of the plurality of substrates, and the at least one substrate comprises a fiberglass cloth made of a different material from that included in the other of the plurality of substrates, wherein said fiberglass cloth contained in said at least one substrate provided with the wiring for transmitting the higher speed signal has a lower dielectric constant than that of fiberglass cloths included in the other of the plurality of substrates, wherein a material of resin used for said at least one substrate provided with the wiring for transmitting the higher speed signal and the other of the plurality of substrates are the same, and wherein in each of said substrate provided with the wiring for transmitting the higher speed signal and the other substrates is included more than one layer.

2. The printed circuit board according to claim 1, wherein a prepreg is provided at each interface between the plurality of substrates, and a prepreg arranged onto the surface, of said at least one substrate provided with a wiring for transmitting a higher speed signal, on a side of said wiring having a lower dielectric constant than that of plurality of prepregs in contact only with the other of the plurality of substrates.

3. The printed circuit board according to claim 2, wherein each of said plurality of prepregs contains a fiberglass cloth, and wherein a prepreg arranged onto the surface, of said at least one substrate provided with a wiring for transmitting a higher speed signal, on the side of said wiring containing a fiberglass cloth having a lower dielectric constant than that of fiberglass cloths contained in the plurality of prepregs in contact only with the other of the plurality of substrates.

4. The printed circuit board according to claim 1, wherein, in said at least one substrate provided with a wiring for transmitting a higher speed signal, said fiberglass cloth with the lower dielectric constant is contained only in a vicinity of said wiring.

5. The printed circuit board according to claim 1, wherein said fiberglass cloth contained in said at least one substrate provided with a wiring for transmitting a higher speed signal has a lower thermal expansion coefficient than that of fiberglass cloths used in the other of the plurality of substrates.

6. The printed circuit board according to claim 5, wherein a prepreg is provided at each interface between the plurality of substrates, and a prepreg arranged onto the surface, of said at least one substrate provided with a wiring for transmitting a higher speed signal, on a side of said wiring having a lower thermal expansion coefficient than that of the plurality of prepregs in contact only with the other of the plurality of substrates.

7. The printed circuit board according to claim 6, wherein each of said plurality of prepregs contains a fiberglass cloth, and a prepreg arranged onto the surface, of said at least on substrate provided with a wiring for transmitting a higher speed signal, on the side of said wiring containing a fiberglass cloth having a lower thermal expansion coefficient than that of fiberglass cloths contained in the plurality of prepregs in contact only with the other substrates.

8. The printed circuit board according to claim 1, wherein D-glass or S-glass is used for said fiberglass cloth made of different material, and E-glass is used for fiberglass cloths other than said fiberglass cloth made of different material.

9. An electronic device comprising the printed circuit board according to claim 1.

* * * * *